(12) United States Patent
Jen et al.

(10) Patent No.: US 6,737,920 B2
(45) Date of Patent: May 18, 2004

(54) VARIABLE GAIN AMPLIFIER

(75) Inventors: Hung-Min Jen, Cupertino, CA (US); David K. Su, Mountain View, CA (US)

(73) Assignee: Atheros Communications, Inc., Sunnyvale, CA (US)

( * ) Notice: Subject to any disclaimer, the term of this patent is extended or adjusted under 35 U.S.C. 154(b) by 0 days.

(21) Appl. No.: 10/138,048

(22) Filed: May 3, 2002

(65) Prior Publication Data

US 2003/0206062 A1 Nov. 6, 2003

(51) Int. Cl.$^7$ .................................................. H03F 3/45
(52) U.S. Cl. ............................................ 330/254; 330/260
(58) Field of Search ................................ 330/253, 254, 330/260, 292, 295

(56) References Cited

U.S. PATENT DOCUMENTS

| | | | |
|---|---|---|---|
| 5,838,199 A | 11/1998 | Nakamura | 330/258 |
| 6,084,473 A | 7/2000 | Nauta et al. | 330/254 |
| 6,392,490 B1 * | 5/2002 | Gramegna et al. | 330/296 |
| 6,552,612 B1 * | 4/2003 | Wilson | 330/254 |

FOREIGN PATENT DOCUMENTS

JP 2001007667 1/2001

WO WO 02/03548 1/2002

OTHER PUBLICATIONS

Mataya et al., "IF Amplifier Using $C_c$ Compensated Transistors," *IEEE Journal of Solid–State Circuits* (1968) vol. sc–3, No. 4, pp. 401–407.

* cited by examiner

*Primary Examiner*—Khanh Van Nguyen
(74) *Attorney, Agent, or Firm*—Pillsbury Winthrop LLP

(57) ABSTRACT

The present invention provides a variable gain amplifier with a plurality of gain stages in which each of the gain stages is implemented using a circuit that implements a neutralization approach. This variable gain amplifier provides stable operation characteristics as different gain stages within the variable gain amplifier are turned on and off. This variable gain amplifier also increases linearity across the entire operating range. Additionally, the variable gain amplifier of the present invention provides a constant input impedance through different gain settings. Further, the present invention provides a variable gain amplifier in which each of the various gain stages therein maximize the available voltage swing. Finally, this variable gain amplifier improves common-mode rejection performance and attenuates unwanted harmonics.

19 Claims, 5 Drawing Sheets

VARIABLE GAIN AMPLIFIER

FIELD OF THE INVENTION

The present invention relates to a variable gain amplifier, and more specifically a variable gain amplifier with improved linearity characteristics.

BACKGROUND OF THE RELATED ART

Variable gain amplifiers (VGAs) are well known. In the communication industry, particularly for wireless communications, variable gain amplifiers are well known as being used to provide amplification of either intermediate frequency (IF) or radio frequency (RF) signals. In a variable gain amplifier, a control unit will provide a gain signal to the variable gain amplifier, and, based upon the gain signal, the variable gain amplifier will accordingly amplify an input signal by an amount corresponding to the gain signal, to obtain an amplifier output signal.

While the proper selection of the gain signal that is input to the variable gain amplifier is needed in any variable gain amplifier, the components that are used to implement the variable gain amplifier are also significant. As illustrated in FIG. 1, it would be desirable to obtain a variable gain amplifier in which the input signal and the output signal are linearly related, as illustrated by the plot labeled "Ideal." While in practice this ideal is not possible, obtaining input-output characteristics that are closer to ideal is desired.

A conventional variable gain amplifier will have input-output characteristics that that are illustrated in the plot labeled "Conventional" in FIG. 1. As seen, the greater the gain, typically the greater the amount of non-linearity that is introduced.

The most generic variable gain amplifier is a differential pair with a tail current source. The gain is adjusted by varying the bias current of the tail current source. This is continuous analog adjustment. A variant of this generic variable gain amplifier is to use a plurality of differential pairs that are digitally switched for gain control.

An exemplary conventional variable gain amplifier is illustrated in FIGS. 2A and 2B. As shown, the variable gain amplifier 200 contains a plurality of parallel connected gain stages 210, with each gain stage having a common input 212, and a common output 214 with inductive load 216 at the common output 214. Each gain stage 210 contains a combination of an amplifier 220 and a switch 222 (further illustrated as switches M3 and M4 in FIG. 2A). The amplifier 220 within each gain stage 210 will provide a portion of the gain, with the collective gain being determined by the gain from the amplifier 220 within each gain stage 210 as well as the state of the switches 222, which determines whether the gain stage 210 is connected to the common output 212. By powering on a different number of gain cells, current flowing into output inductors 216 is changed and results in a different gain. For example, VGA has its minimum gain by only powering on gain stage 1. With gain stage 1 and gain stage 2 powered on, the variable gain amplifier 200 will obtain 6 dB more gain, and with all the gain stages powered on, the variable gain amplifier 200 will achieve its maximum gain.

The gain stage 210 illustrated in FIG. 2A is illustrated in more detail in FIG. 2B. As shown, a differential common-source cascode amplifier is used to minimize the input impedance variation through different gain settings.

In order to maintain the accuracy of gain over a wide frequency range, such as from a 5.15 GHz lower band to a 5.825 GHz upper band of unlicensed national information structure (U-NII) bands, the input impedance of the variable gain amplifier 200 has to maintain the same value over different gain settings. Theoretically, due to Miller Effect, any capacitance across input and output nodes will be amplified by the gain and shown at the input node. As shown in FIG. 2B, the overlap capacitance, Cgd, of input transistors, M1 and M2, will have different effective loading for input nodes, node-A and node-B, with the gain cell powered on or off. In order to reduce the variation of this effective loading over different gain settings, the cascode devices, M3 and M4, are added to reduce the gain across node-A and node-G (node-B and node-H). This cascode scheme is also known as unilaterization.

While, the cascode device can reduce the gain across Cgd and minimize Miller Effect, extra transistors M3 and M4 are needed on the signal path. Thus, the variable gain amplifier 200 requires more voltage headroom between node-C and node-E (node-D and node-F) for the proper biasing condition. This results the drop of maximum allowable output voltage swing to (Vdd−2* Vdsat), and makes poor linearity performance for large signals. Further, the common-source is directly connected to a current source, Ibias, which is not an ideal high-impedance node. This results in poor common-mode rejection.

Amplifiers are also known which operate in a manner that decouple the inputs and outputs of the amplifier. One particular class of such amplifiers operates in a manner in which undesired feedback is cancelled. Such amplifiers are known as using a neutralization approach, rather than amplifiers that use a unilaterization approach in which signals can flow only one way over large bandwidths and thereby eliminate, rather than cancel, undesired feedback.

FIG. 3 illustrates an example of such an amplifier that uses a neutralization approach. Such amplifiers that implement a neutralization approach are not widely used. One reason for not widely being used, as discussed in "The Design of CMOS Radio Integrated Circuits" by Thomas H. Lee, pp. 203–206, Cambridge University Press, 1998 is that providing a circuit with neutralization can be difficult, since obtaining canceling can require circuits in which a capacitance must match another capacitance in order for the cancellation to occur. In many cases, however, the capacitance that must match is other voltage dependent capacitance, which can make obtaining that match across the entire operating range difficult.

The conventional manner of implementing a variable gain amplifier has been to use a circuit such as illustrated in FIGS. 2A and 2B, and then alter the current in order to obtain the desired variable gain, which allow such voltage dependency as discussed above to exist. Accordingly, neutralization circuits have not previously been used in variable gain amplifiers, and particularly in variable gain amplifiers implemented in CMOS. Rather, conventional circuits only use an amplifier that utilizes the unilaterization approach.

SUMMARY OF THE INVENTION

An advantage of the present invention is increased linearity across the entire range of the variable gain amplifier.

Another advantage of the present invention is providing a variable gain amplifier with stable operation characteristics as different gain stages within the variable gain amplifier are turned on and off.

It is another advantage of the present invention to provide constant input impedance through different gain settings.

A further advantage of the present invention is to provide a variable gain amplifier in which each of the various gain stages therein maximize the available voltage swing.

A further advantage of the present invention is to improve common-mode rejection performance and attenuate unwanted harmonics.

The above advantages, either singly or in combination, among others, are achieved by different aspects of the present invention.

In one aspect, the present invention provides a variable gain amplifier with a plurality of gain stages in which each of the gain stages is implemented using a circuit that implements a neutralization approach.

The above and other aspects of the present invention will be described herein.

BRIEF DESCRIPTION OF THE DRAWINGS

The above and other objects, features, and advantages of the present invention are further described in the detailed description which follows, with reference to the drawings by way of non-limiting exemplary embodiments of the present invention, wherein like reference numerals represent similar parts of the present invention throughout several views and wherein.

DETAILED DESCRIPTION OF THE PREFERRED EMBODIMENTS

The present invention provides a variable gain amplifier in which each of the gain stages use an amplification circuit with a neutralization approach in which impedance changes within each gain stage, which occur when the gain stage is turned on and off, are substantially cancelled. Thus, one aspect of the present invention is to provide constant input impedance through different gain settings or load changes. In other words, an aspect of the present invention is to maintain the RF tuning for previous stage and have constant gain steps over operation frequencies.

Figure 1:
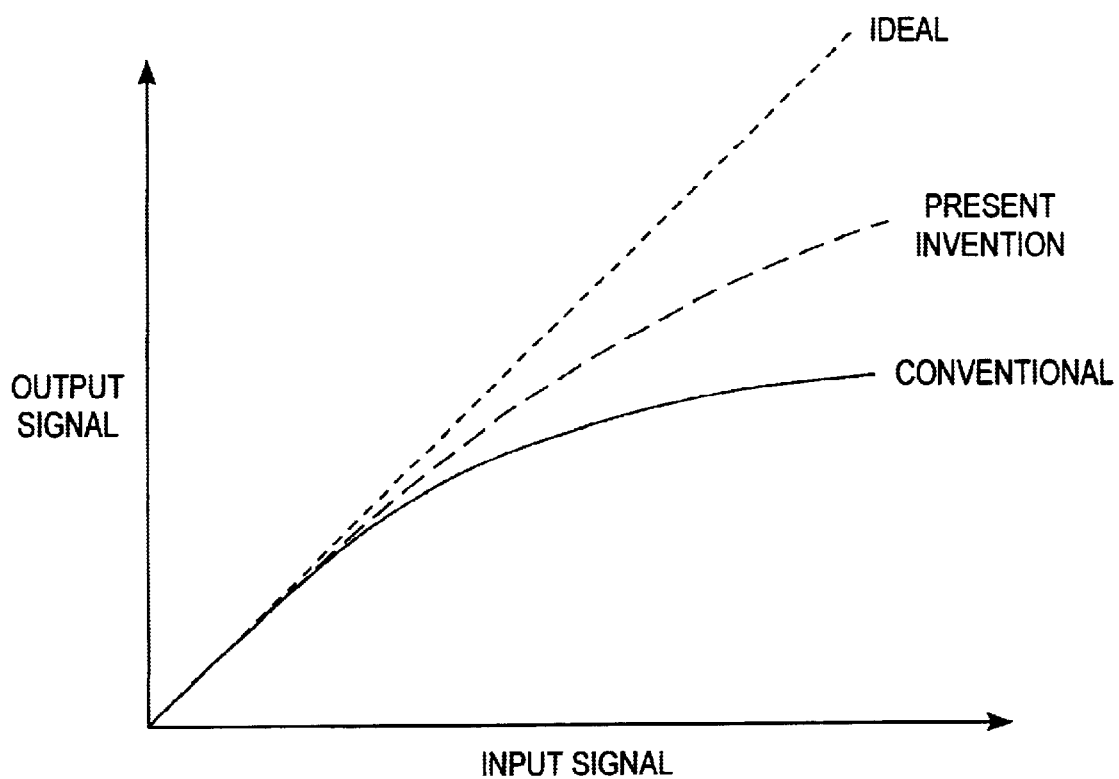
FIG. 1 illustrates a graph of amplification characteristics for an ideal case, a conventional variable gain amplifier, and a variable gain amplifier according to the present invention.
Figure 2A:
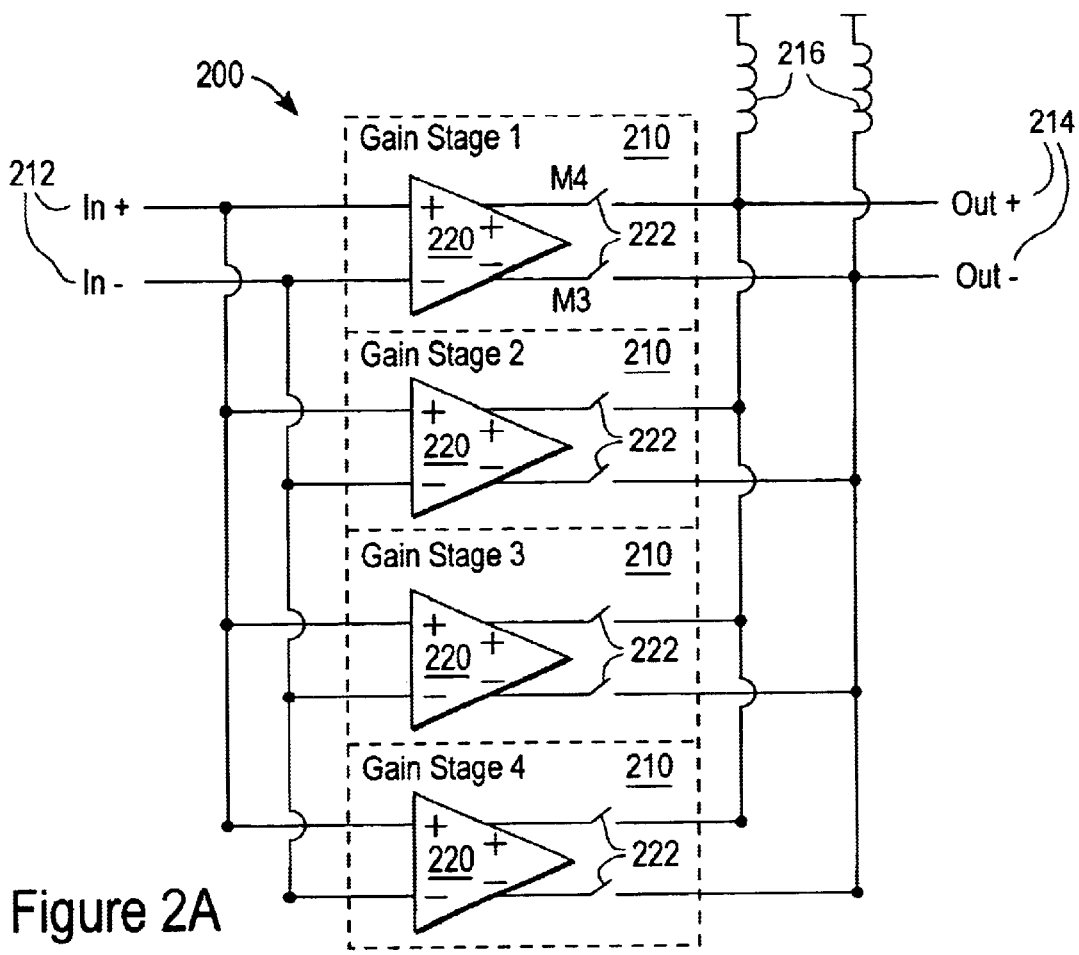
FIGS. 2A and 2B illustrate a conventional variable gain amplifier.
Figure 2B:
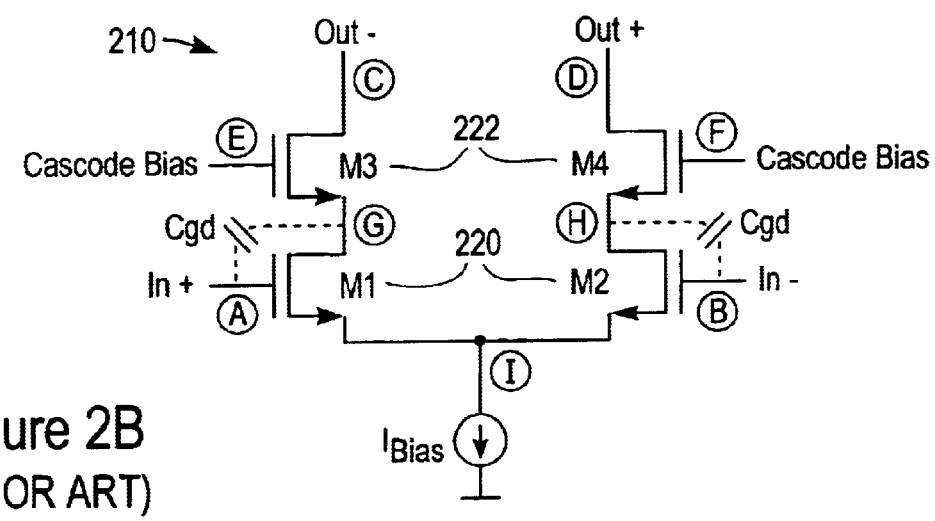
Figure 3:
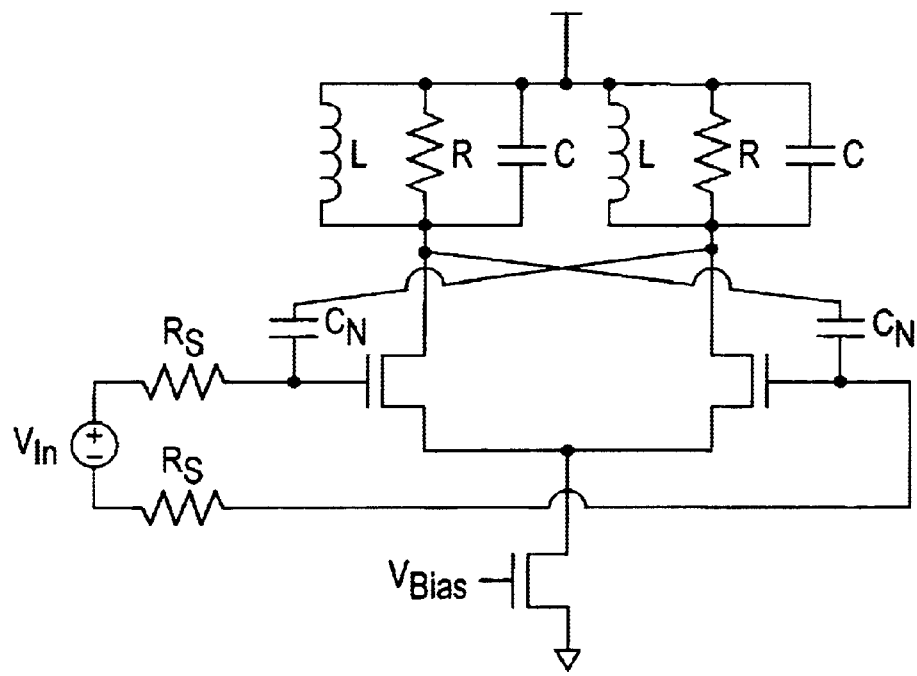
FIG. 3 illustrate a conventional amplifier circuit conventionally used to obtain neutralization.
Figure 4:
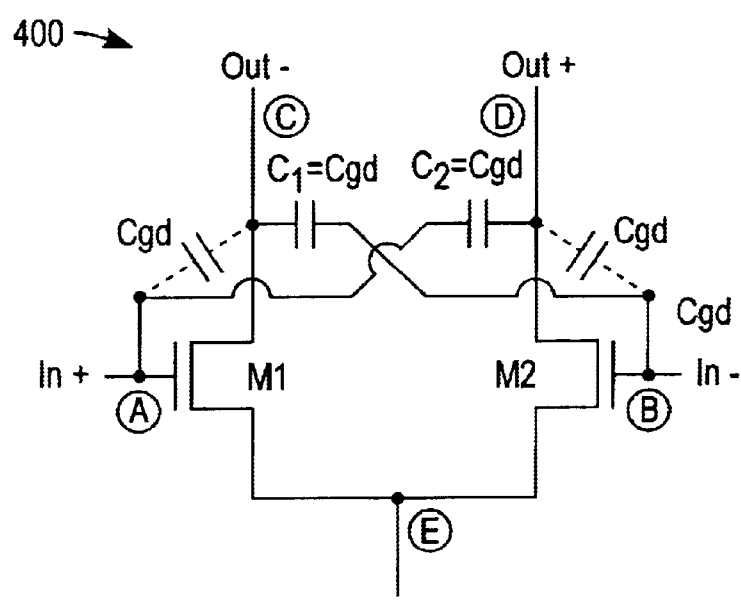
FIG. 4 illustrates a conceptual differential gain cell that is used to explain the present invention.

A conceptual differential gain cell 400 is illustrated in FIG. 4 and will be used to explain certain concepts according to the present invention. During operation, in order to achieve constant input impedance, the Miller Effect, generated by gate-to-drain capacitance (Cgd) of transistors M1 and M2 of the differential gain cell 400 illustrated in FIG. 4, needs to be minimized or canceled. Assume the signal gain from in+ to out+ is Av+ and signal gain from in+ to out− is Av−. Because of the differential operation scheme, the signal phase at out+ and out− are 180 degree different, (Av+)=−(Av−). Therefore, placing a capacitor C2 between node-A and node-D as figuratively shown, with the value of capacitor C2 equal to Cgd, can cancel out the Miller Effect of Cgd of M1. Capacitor C1 can be used to cancel the Miller Effect of Cgd of M2. Thus, the total input impedance will maintain constant no matter whether the gain cell is powered on or off.

Figure 5A:
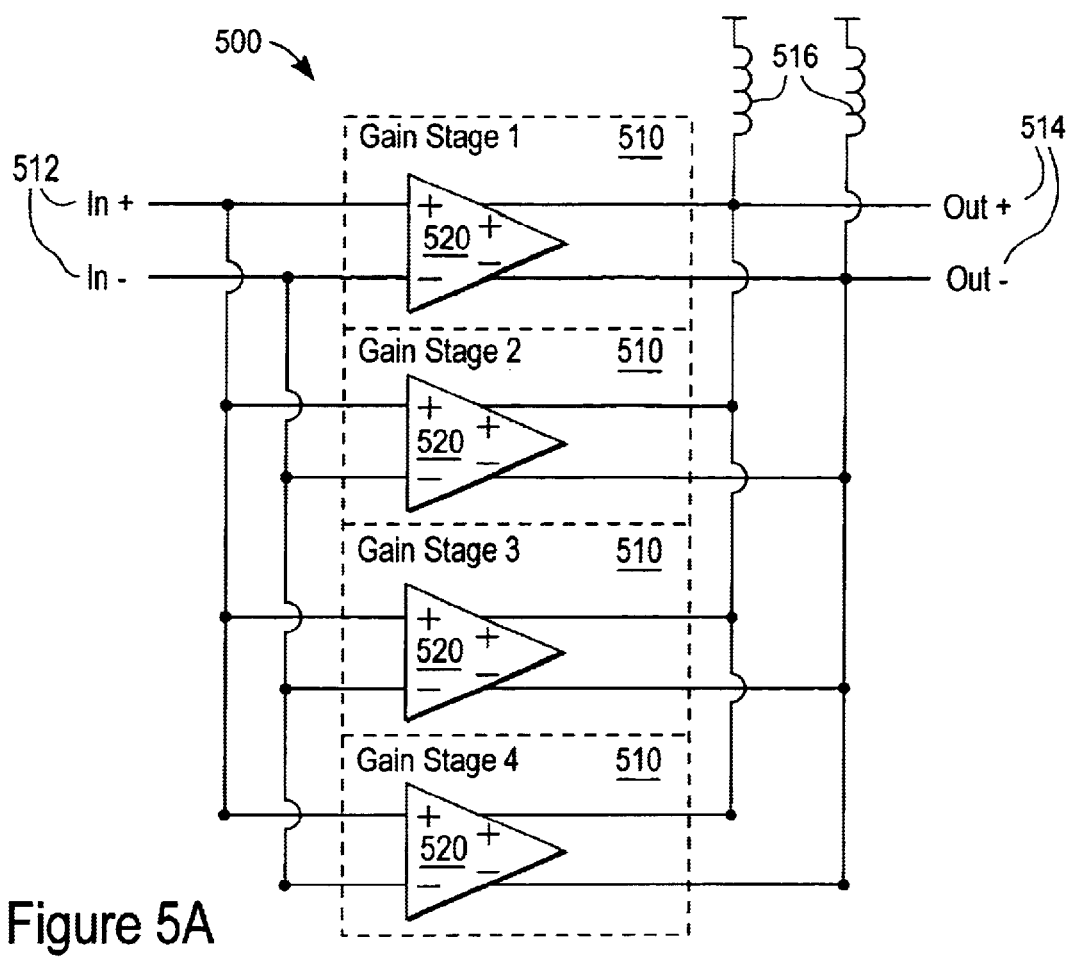
FIGS. 5A through 5C illustrate a variable gain amplifier according to the present invention.
Figure 5B:
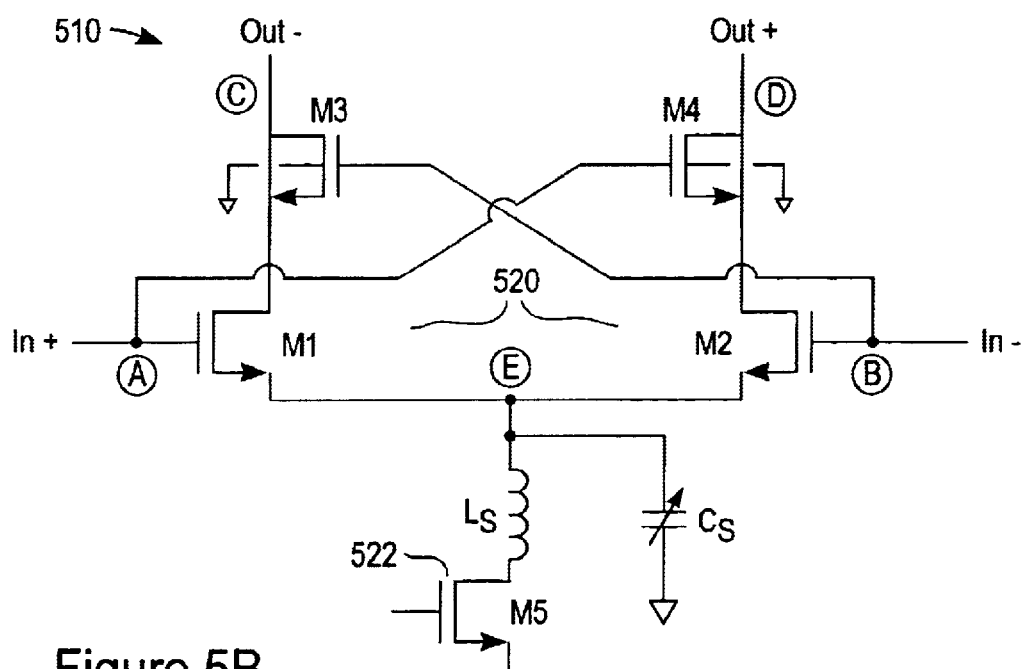

FIG. 5B illustrates a gain cell that implements the above concepts and can be used as an actual gain stage 510 for the variable gain amplifier 500 illustrated in FIG. 5A. Before further discussing the gain stage 510 of the variable gain amplifier 500, it is noted that the variable gain amplifier 500 also contains a plurality of parallel connected gain stages 510, with each gain stage having a common input 512, and a common output 514 with inductive load 516 at the common output 514. Each gain stage 510 contains a combination of an amplifier 520 and a switch 522 that will now be further described. Also, the variable gain amplifier 500 is preferably implemented on an integrated circuit, using CMOS fabrication techniques, although other types of fabrication techniques and technology can also be used, such as implementing the amplifiers with bipolar junction transistors.

As illustrated in FIG. 5B, NMOS transistors M1 and M2 form a differential pair of the amplifier 520 referred to above. It is noted that the differential pair does not use a cascode circuit configuration. In order for the impedance referred to above to be cancelled, capacitors C1 and C2, of FIG. 4, associated with the differential pair have to be the same value of Cgd of M1 and M2. Thus, capacitors C1 and C2 are formed by NMOS transistors M3 and M4 that are connected to implement these capacitors, which transistors M3 and M4 are similar to transistors M1 and M2, with half of the channel width operating in accumulation region. Under this bias condition, the only capacitance shown on gate-drain/source is overlap capacitance.

Thus, with this differential pair configuration of transistors M1 and M2 and associated capacitors C1 and C2 for the gain stage 510 illustrated in FIG. 5B, approximately constant impedance is maintained, thereby maintaining the impedance tuning of the previous stage of the circuit (which could be, for example, either an IF or an RF mixer). This differential pair and the capacitors are both preferably implemented as NMOS transistors, but the differential pair could also be implemented as bipolar junction transistors and the capacitors C1 and C2 could also be implemented by other types of integrated or non-integrated circuit devices such as metal capacitors, MIM capacitors, or junction capacitors.

Figure 5C:
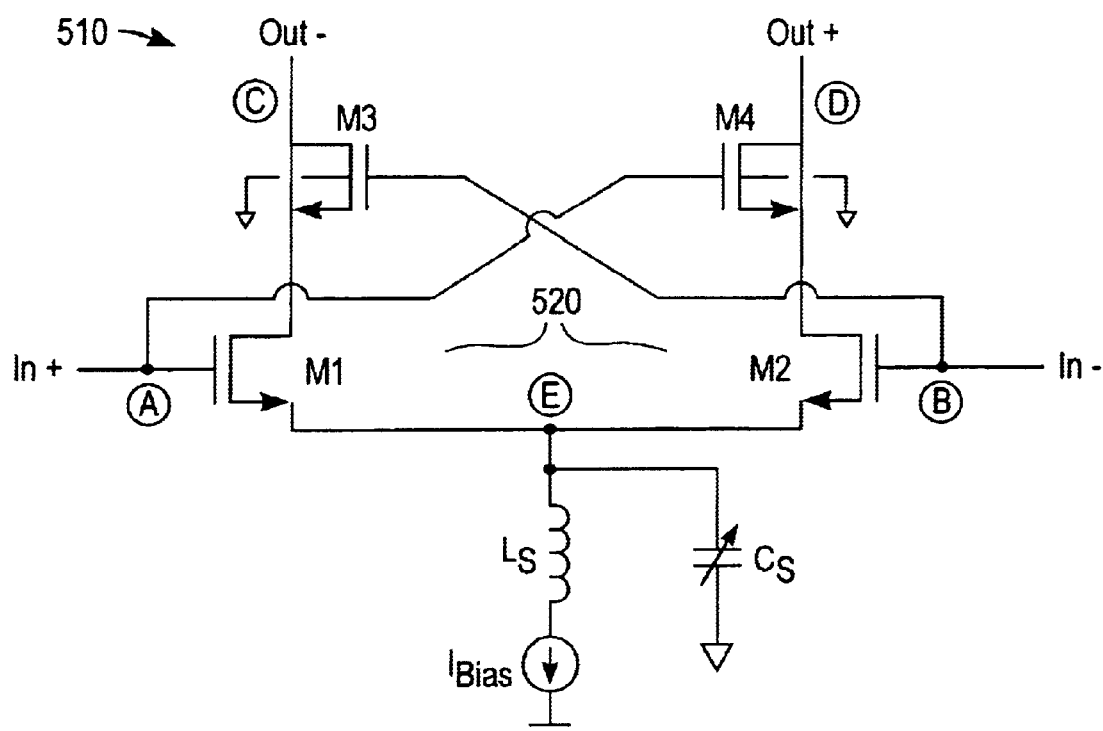

Another aspect of the present invention is to obtain the maximum allowable output voltage swing, thereby obtaining better gain-compression performance (linearity) for larger output signals. As shown in FIG. 5B, this is provided since only one transistor (MI or M2) is placed between output and common-source node (node E shown), the output can swing as much as (Vdd−Vdsat). Therefore it provides larger voltage swing range and better linearity for large signal. Further, in the common-source node, instead of a current source, a MOS switch, shown as transistor M5 in FIG. 5B, is preferably connected to switch on and off the gain stage 510, although a current source can be used, as illustrated by Ibias in FIG. 5C. This further improves the output voltage swing headroom by another Vdsat.

Still another aspect of the present invention is maximizing node impedance at common-source node, and thereby improving common-mode rejection performance and attenuating unwanted harmonics. As also shown in FIG. 5B, the inductor, Ls, is placed at the common-source node of the differential pair M1, M2 to resonate out all the associated capacitances and produce a high-impedance node. While this inductor Ls does not affect any DC bias condition, it rejects the unwanted common-mode signal and even harmonics. Capacitor Cs shown in FIG. 5B represents a switched variable capacitor used to adjust the tuning frequency at the common-source node for noise rejection at the proper frequency.

While the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the spirit and scope of the invention as set forth in the appended claims.

We claim:

1. A circuit that receives an input signal and control signals, and outputs an amplified signal, comprising:
    a differential input that receives the input signal;
    a differential output that outputs the amplified signal; and
    a variable gain amplifier coupled between the differential input and the differential output, the variable gain amplifier containing a plurality of gain stages arranged in parallel, with each gain stage comprising:
        a differential pair of transistors; and
        a pair of cross-connected capacitors coupled to the differential pair of transistors, each cross-connected capacitor coupled from an input of one of the differential pair of transistors to an output of another of the differential pair of transistors, and configured to substantially cancel any undesired signals that cause feedback and thereby maintain substantially constant impedance within each gain stage, and
    wherein the control signals determine which of the plurality of gain stages are used to amplify the input signal to obtain the amplified signal.

2. The circuit according to claim 1 wherein the differential input, the differential output and the variable gain amplifier are implemented in an integrated circuit.

3. The circuit according to claim 2 wherein the differential pair of transistors are MOS transistors each having a source connected together, and each gate receiving one of the differential input signals.

4. The circuit according to claim 3 wherein the MOS transistors are NMOS transistors.

5. The circuit according to claim 4 wherein the pair of cross-connected capacitors are each formed using another NMOS transistor configured as a capacitor, with a source of each another NMOS transistor is connected to the drain of one of the NMOS transistors, a drain of each another NMOS transistor is connected to the associated output of the differential output, and a gate of each another NMOS transistor connected to the gate another one of the NMOS transistors.

6. The circuit according to claim 5 further including an inductive load coupled to the differential output.

7. The circuit according to claim 6 further including a MOS transistor switch coupled between the connected sources of the NMOS transistors and ground.

8. The circuit according to claim 7 further including an inductor coupled between the connected sources of the NMOS transistors and the drain of the MOS transistor switch.

9. The circuit according to claim 6 further including a current source coupled between the connected sources of the NMOS transistors and ground.

10. The circuit according to claim 8 further including a switched variable capacitor coupled between the connected source of the NMOS transistors and ground.

11. The circuit according to claim 5 wherein the differential pair of transistors does not contain additional transistors arranged in a cascode configuration.

12. The circuit according to claim 5 wherein the differential pair of transistors is an RF differential pair of transistors.

13. The circuit according to claim 2 further including an inductive load coupled to the differential output.

14. The circuit according to claim 2 further including a MOS transistor switch coupled between the differential pair of transistors and ground.

15. The circuit according to claim 14 further including an inductor coupled between the source of differential pair of transistors and the drain of the MOS transistor switch.

16. The circuit according to claim 2 further including a current source coupled between the differential pair of transistors and ground.

17. The circuit according to claim 6 further including a current source coupled between the differential pair of transistors and ground.

18. The circuit according to claim 2 wherein the differential pair of transistors does not contain additional transistors arranged in a cascode configuration.

19. The circuit according to claim 1 wherein the differential pair of transistors does not contain additional transistors arranged in a cascode configuration.

* * * * *